(12) United States Patent
Kim

(10) Patent No.: US 8,138,044 B2
(45) Date of Patent: Mar. 20, 2012

(54) METHOD FOR MANUFACTURING SEMICONDUCTOR FLASH MEMORY AND FLASH MEMORY CELL

(75) Inventor: Hyun-Tae Kim, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 67 days.

(21) Appl. No.: 12/647,502

(22) Filed: Dec. 27, 2009

(65) Prior Publication Data

US 2010/0163961 A1 Jul. 1, 2010

(30) Foreign Application Priority Data

Dec. 30, 2008 (KR) .......................... 10-2008-0137574

(51) Int. Cl.
*H01L 21/8238* (2006.01)

(52) U.S. Cl. ................. 438/261; 257/316; 257/E21.422; 257/E29.3; 257/E29.304; 257/321

(58) Field of Classification Search .................. 438/261; 257/321, 316, E21.422, E29.3, E29.304

See application file for complete search history.

(56) References Cited

U.S. PATENT DOCUMENTS

| | | | |
|---|---|---|---|
| 2002/0145167 A1* | 10/2002 | Yamazaki | 257/370 |
| 2009/0309226 A1* | 12/2009 | Horak et al. | 257/762 |
| 2010/0029052 A1* | 2/2010 | Kang et al. | 438/261 |

* cited by examiner

*Primary Examiner* — Bradley K Smith
*Assistant Examiner* — Mohammad T Karimy
(74) *Attorney, Agent, or Firm* — Sherr & Vaughn, PLLC

(57) ABSTRACT

A semiconductor flash memory includes a tunnel oxide film formed over a semiconductor substrate, a first spacer composed of polysilicon formed over the semiconductor substrate including the tunnel oxide film, a second spacer composed of an insulating material formed at sidewalls of the first spacer, a dielectric film formed at the uppermost surface of the first spacer and the second spacer, a control gate formed at the uppermost surface of the dielectric film, and a third spacer composed of an insulating material formed at and contacting sidewalls of the second spacer, the dielectric film and the control gate. A first source/drain region formed may be formed in the semiconductor substrate and self-aligned with the first spacer and a second source/drain region may be formed in the semiconductor substrate and self-aligned with the second spacer.

3 Claims, 4 Drawing Sheets

METHOD FOR MANUFACTURING SEMICONDUCTOR FLASH MEMORY AND FLASH MEMORY CELL

The present application claims priority under 35 U.S.C. §119 to Korean Patent Application No. 10-2008-0137574 (filed on Dec. 30, 2008), which is hereby incorporated by reference in its entirety.

BACKGROUND

A flash memory cell may have a double polysilicon structure such that information can be stored in and deleted from a specific cell.

Figure 1:
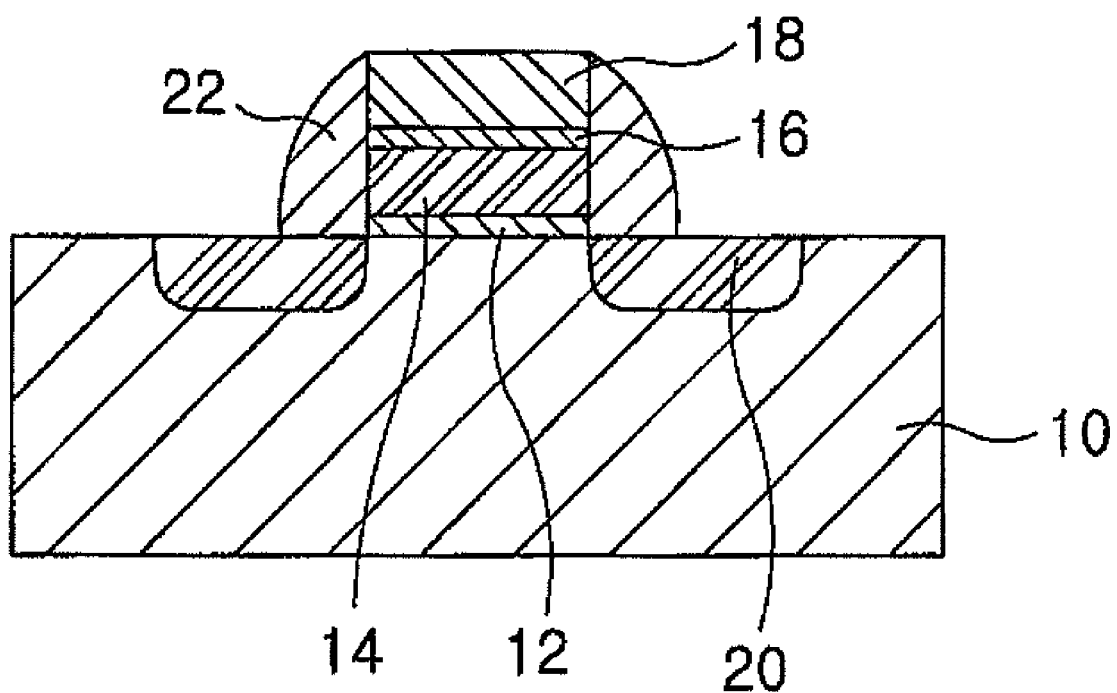

FIG. 1 illustrates an Electrically Erasable Programmable Read Only Memory (EEPROM) or a flash memory cell having a double polysilicon structure in a memory block.

As illustrated in FIG. 1, a flash memory cell of a double polysilicon structure has tunnel oxide film 12, floating gate 14, dielectric film 16, control gate 18, source region 20, spacer 22, and the like formed in that order on and/or over semiconductor substrate 10. Accordingly, such a flash memory cell has two gates: floating gate 14 and control gate 18. Floating gate 14 and control gate 18 are separated from each other by dielectric film 16. Floating gate 14 and semiconductor substrate 10 are separated from each other by tunnel oxide film 12.

In such a flash memory, data storage is implemented by injecting electrons or holes into floating gate 14 or by erasing electrons or holes from floating gate 14. Meaning, since floating gate 14 is completely separated by tunnel oxide film 12 and dielectric film 16, e.g., an Oxide+Nitride+Oxide (ONO) dielectric film, electrons or holes injected into floating gate 14 do not escape floating gate 14 even if power is not supplied, such that data is not lost. For data storage or erasure, a bias applied to an externally accessible terminal, i.e., control gate 18 and the junction or substrate 10 can be induced to floating gate 14, so that a large electric field can be formed between both ends of tunnel oxide film 12.

A ratio of the voltage applied to control gate 18 and the junction or substrate 10 and induced to floating gate 14 is referred to as a coupling ratio (CR). As the coupling ratio is large, efficiency of programming and erase operations for cells can increase, and a voltage applied from the outside can be lowered. Meaning, control gate 18 is an electrode that functions as a gate of a nonvolatile memory having a polysilicon stacked structure. Programming and erasure for cells are performed according to the bias state of this electrode. Generally, after such a gate is etched, the dielectric film is etched.

A process for manufacturing such a semiconductor flash memory is described as follows. First, tunnel oxide film 12 and polysilicon for floating gate 14 are deposited on and/or over semiconductor substrate 10. A silicon nitride film, e.g., tetraethylorthosilicate (TEOS) layer is etched. Polysilicon is then deposited on and/or over the polysilicon for floating gate 14 to form control gate 18, and then a control gate pattern is formed. Control gate 18 is etched so that spacer 22 is formed by an etch-back effect. Polysilicon is etched by using an etching selectivity of an oxide film and polysilicon. When spacer 22 is removed, the underlying oxide film and nitride film are removed. In this case, an ONO step is formed between two layers of polysilicon. Finally, ONO is etched again to remove the ONO at sidewall.

In this way, in the flash memory cell, programming or erasure is performed in accordance with presence/absence of electrons in the floating gate on the gate oxide film. The floating gate is insulated by the ONO structure or a similar structure, and the control gate is deposited as an upper electrode. Programming or erasure of cells is determined by the bias applied to the control gate. To increase the operation speed of such a flash memory cell, it is necessary to reduce a cell size, but it is difficult to reduce the cell size since a general transistor is used, as illustrated in FIG. 1. Nevertheless, it is very important to reduce the area of the flash memory cell for increasing the entire memory density and the memory operation speed thereby enhancing memory performance.

SUMMARY

Embodiments relate to a flash memory cell and a method of manufacturing a semiconductor flash memory for reducing a cell size to increase a memory operation speed.

Embodiments relate to a flash memory cell and a method of manufacturing a semiconductor flash memory that reduces the size of a floating gate by using sidewall polysilicon as the floating gate, thereby reducing a cell size and increasing a coupling ratio to the floating gate.

In accordance with embodiments, a method of manufacturing a semiconductor flash memory can include at least one of the following: forming a hard mask pattern by depositing an oxide film on and/or over a semiconductor substrate and performing patterning and etching thereto; forming a tunnel oxide film on and/or over the semiconductor substrate having the hard mask pattern formed thereon and/or thereover; depositing polysilicon on and/or over the hard mask pattern on and/or over which the tunnel oxide film has been formed and performing etching to form a first spacer at the sidewall of the hard mask pattern; partially removing the hard mask pattern and the tunnel oxide film and forming a source/drain region self-aligned with the first spacer; and then forming a second spacer at the sidewall of the first spacer.

In accordance with embodiments, a method of manufacturing a semiconductor flash memory can include at least one of the following: forming a hard mask pattern by depositing an oxide film over a semiconductor substrate and performing patterning and a first etching process on the oxide film; forming a tunnel oxide film over the semiconductor substrate including the hard mask; forming a first spacer serving as a floating gate at sidewalls of the hard mask by depositing a first polysilicon layer over the semiconductor substrate, the hard mask pattern and the tunnel oxide film and then performing a second etching process; performing a third etching process removing the hard mask pattern and a portion of the tunnel oxide film; forming a source/drain region self-aligned with the first spacer by conducting a first ion-implantation process on the semiconductor substrate; and then forming a second spacer at sidewalls of the first spacer by forming an insulating layer over the entire surface of the semiconductor substrate and then performing a fourth etching process on the insulating layer.

In accordance with embodiments, a flash memory cell can include at least one of the following: a semiconductor substrate; a tunnel oxide film formed on and/or over the semiconductor substrate; a first spacer formed on and/or over the semiconductor substrate having the tunnel oxide film formed thereon and/or thereover; a second spacer formed at the sidewall of the first spacer; a dielectric film formed at upper portions of the first spacer and the second spacer; a control gate formed at an upper portion of the dielectric film; and a third spacer formed at the sidewalls of the control gate and the second spacer.

In accordance with embodiments, a flash memory cell can include at least one of the following: a semiconductor substrate; a tunnel oxide film formed over the semiconductor substrate; a first spacer composed of polysilicon formed over the semiconductor substrate including the tunnel oxide film; a second spacer composed of an insulating material formed at sidewalls of the first spacer; a dielectric film formed at the uppermost surface of the first spacer and the second spacer; a control gate formed at the uppermost surface of the dielectric film; and a third spacer composed of an insulating material formed at and contacting sidewalls of the second spacer, the dielectric film and the control gate.

In accordance with embodiments, a flash memory cell can include at least one of the following: a semiconductor substrate; an insulating film pattern formed over and contacting the semiconductor substrate; a first spacer composed of polysilicon formed over and contacting the insulating film pattern film; a second spacer formed over and contacting sidewalls of the first spacer; a dielectric film formed over and contacting the uppermost surface of the first spacer and the second spacer; a control gate formed over and contacting the uppermost surface of the dielectric film; a third spacer formed over and contacting sidewalls of the second spacer, the dielectric film and the control gate; a first source/drain region formed in the semiconductor substrate and self-aligned with the first spacer; and a second source/drain region formed in the semiconductor substrate and self-aligned with the second spacer.

In accordance with embodiments, the floating gate of the flash memory can be reduced in size, thereby increasing the operation speed of cells and reducing a delay time. Further, a voltage applied to the floating gate can be reduced, thereby increasing operation efficiency and enhancing reliability characteristics. As the floating gate is reduced in size, a coupling ratio of a bias applied from the control gate to be induced to the floating gate can be increased.

DRAWINGS

FIG. 1 is a process sectional view illustrating a method of manufacturing a semiconductor flash memory.

Example FIGS. 2A to 2J are process sectional views illustrating a method of manufacturing a semiconductor flash memory in accordance with embodiments.

DESCRIPTION

Hereinafter, an embodiment of the invention will be described in detail with reference to the accompanying drawings which form a part hereof.

Example FIGS. 2A to 2J are process sectional views illustrating a method of manufacturing a semiconductor flash memory, in accordance with embodiments.

Figure 2A:
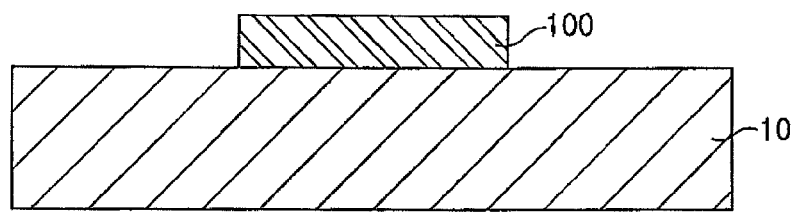

As illustrated in example FIG. 2A, an oxide film to serve as a hard mask is deposited on and/or over semiconductor substrate 10, and patterned and etched to form hard mask pattern 100.

Figure 2B:
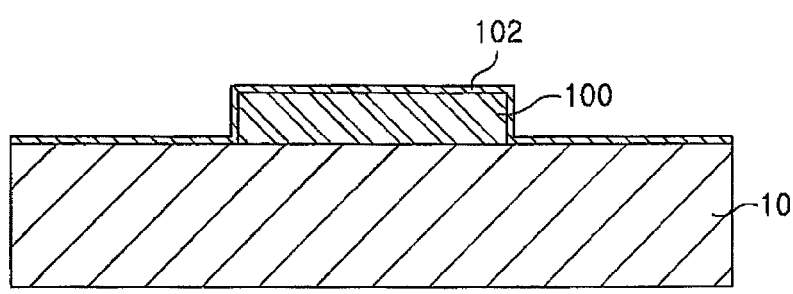

As illustrated in example FIG. 2B, thermal oxidization is performed on and/or over semiconductor substrate 10 including hard mask pattern 100 formed thereon to form tunnel oxide film 102.

Figure 2C:
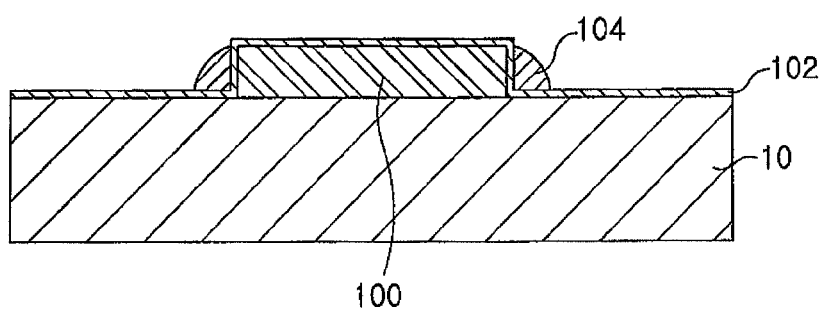

As illustrated in example FIG. 2C, a first polysilicon layer is deposited on and/or over hard mask pattern 100 including tunnel oxide film 102. Etching is then performed to form first spacer 104 composed of polysilicon at sidewalls of hard mask pattern 100. First spacer 104 may correspond to a floating gate of a flash memory cell, as described below. First spacer 104 is referred to as a spacer for a floating gate.

Figure 2D:
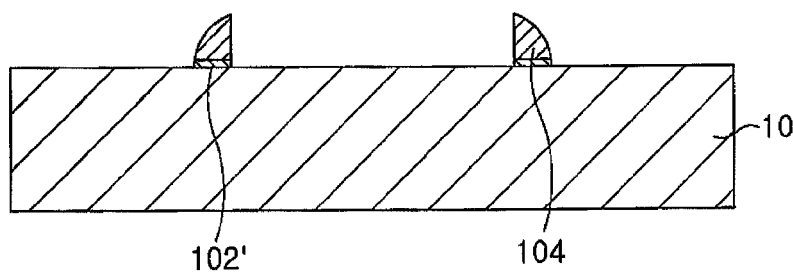

As illustrated in example FIG. 2D, hard mask pattern 100 and a portion of tunnel oxide film 102 are removed using, e.g., dry etching. After the etching, a portion of a tunnel oxide film 102' remains under first spacer 104 interposed between first spacer 104 and semiconductor substrate 10.

Figure 2E:
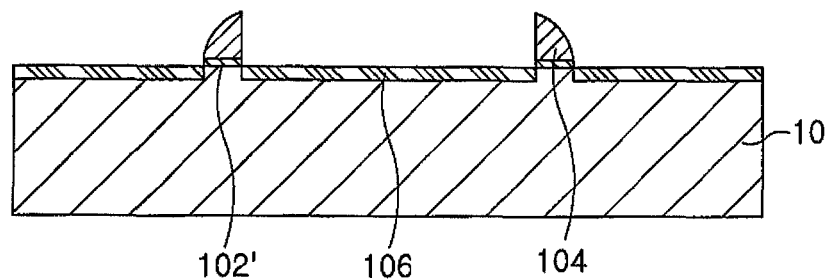

As illustrated in example FIG. 2E, an N-type dopant is ion-implanted in semiconductor substrate 10 to form source/drain region 106. Shallow ion implantation may be performed to lower the level of a current leak and to also induce hot carrier generation. Source/drain region 106 may be formed relatively deep at a time by appropriately controlling ion dosage and energy. If a current leak results, an LDD ion implantation for CMOS may be performed.

Figure 2F:
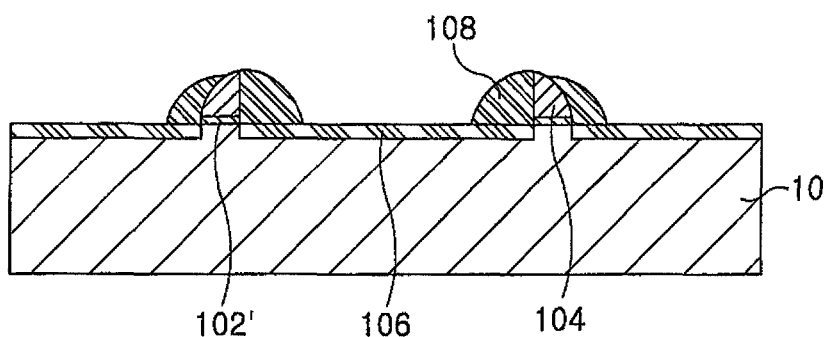

As illustrated in example FIG. 2F, a sidewall process is performed on the sidewalls of first spacer 104 of the floating gate. Specifically, an insulating material is formed on and/or over the entire surface of substrate 10 and etched by dry etching to form second spacer 108 at the sidewalls of first spacer 104 and overlapping a corresponding source/drain region 106. Second spacer 108 is formed to maintain flatness of the floating gate and ensure a sufficient thickness for sidewall deposition.

Figure 2G:
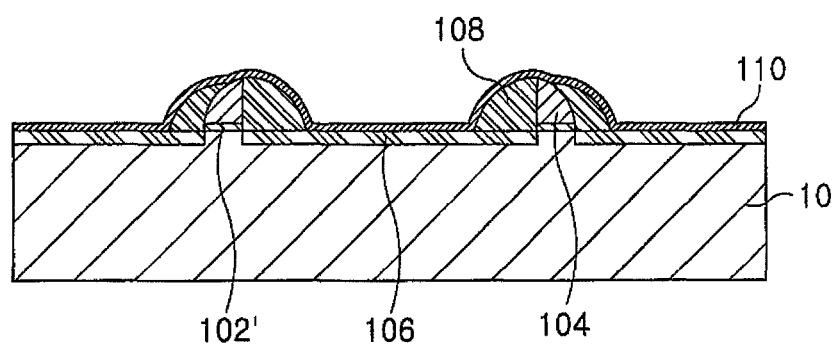

As illustrated in example FIG. 2G, a dielectric film, e.g., Oxide/Nitride/Oxide (ONO) dielectric film 110 is formed on and/or over the entire surface of semiconductor substrate 10 including first spacer 104, source/drain region 106 and second spacer 108. ONO dielectric film 110 should be formed to insulate a floating gate and a control gate described below.

Figure 2H:
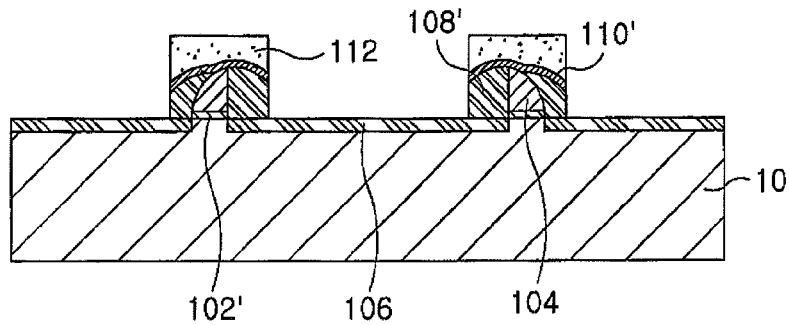

As illustrated in example FIG. 2H, a second polysilicon layer for forming a gate electrode is deposited over the entire surface of semiconductor substrate 10. The second polysilicon layer is then patterned and etched to thereby form control gate 112. A portion of second spacer 108 and ONO dielectric film 110 are also etched during formation of control fate 12 such that respective portions second spacer 108' and ONO dielectric film 110' remain.

Figure 2I:
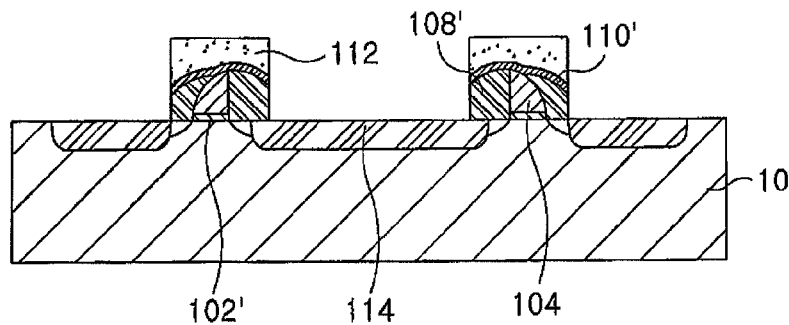

As illustrated in example FIG. 2I, a conductive dopant is ion-implanted with low concentration to form source/drain region 114 self-aligned with second spacer 108'.

Figure 2J:
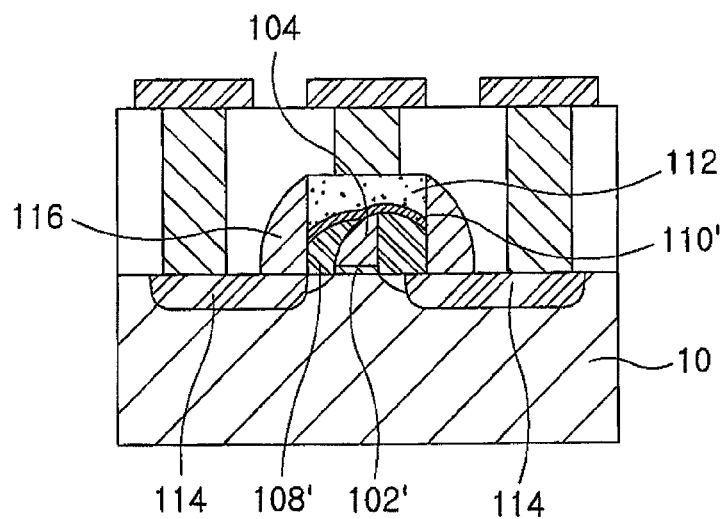

As illustrated in example FIG. 2J, an insulating film is then formed on and/or over the entire surface of substrate 10 and etched by dry etching to form third spacer 116 at the sidewalls of second spacer 108', ONO dielectric film 110' and control electrode 112. Thereafter, a dopant is implanted between device isolation films to form a photodiode. Multilayered metal interconnects are connected to each other through a via.

Accordingly, a flash memory cell implemented by the method of manufacturing a semiconductor flash memory in accordance with embodiments includes semiconductor substrate 10, tunnel oxide film 102' and first spacer 104 serving as a floating gate sequentially formed on and/or over semiconductor substrate 10, first source/drain region 106 self-aligned with first spacer 104 in semiconductor substrate 10, second spacer 108' formed at the sidewalls of first spacer 104, ONO dielectric film 110' formed on and/or over the uppermost surface of first spacer 104 and second spacer 108', control gate 112 formed on and/or over the uppermost surface of ONO dielectric film 110', second source/drain region 114 self-aligned with second spacer 108', and third spacer 116 formed at the sidewalls of control gate 112 and second spacer 108'.

As described above, in accordance with embodiments, the floating gate can be reduced in size by using sidewall polysilicon as the floating gate, thereby reducing the cell size and increasing the coupling ratio to the floating gate.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    forming a hard mask pattern by depositing an oxide film over a semiconductor substrate and performing patterning and a first etching process on the oxide film;
    forming a tunnel oxide film over the semiconductor substrate including the hard mask;
    forming a first spacer serving as a floating gate at sidewalls of the hard mask by depositing a first polysilicon layer over the semiconductor substrate, the hard mask pattern and the tunnel oxide film and then performing a second etching process;
    performing a third etching process removing the hard mask pattern and a portion of the tunnel oxide film;
    forming a source/drain region self-aligned with the first spacer by conducting a first ion-implantation process on the semiconductor substrate;
    forming a second spacer at sidewalls of the first spacer by forming an insulating layer over the entire surface of the semiconductor substrate and then performing a fourth etching process on the insulating layer;
    forming a dielectric film over the entire surface of the semiconductor substrate including the first spacer and the second spacer; and then
    forming a control gate over the first spacer and the second spacer by depositing a second polysilicon layer over the dielectric film and then patterning and a fifth etching process the second polysilicon layer.

2. The method of claim 1, wherein the dielectric film comprises an Oxide/Nitride/Oxide (ONO) dielectric film.

3. The method of claim 1, further comprising, after said forming the control gate:
    forming a second source/drain region self-aligned with the second spacer by conducting a second ion-implantation process which ion-implants a conductive dopant having low concentration in the semiconductor substrate; and then
    forming a third spacer at and contacting sidewalls of the second spacer, the dielectric film and the control gate by forming a second insulating layer over the entire surface of the semiconductor substrate and then performing a sixth etching process on the insulating layer.

* * * * *